United States Patent [19]
Ema

[11] Patent Number: 5,247,197
[45] Date of Patent: Sep. 21, 1993

[54] DYNAMIC RANDOM ACCESS MEMORY DEVICE HAVING IMPROVED CONTACT HOLE STRUCTURES

[75] Inventor: Taiji Ema, Kawasaki, Japan
[73] Assignee: Fujitsu Limited, Kawasaki, Japan
[21] Appl. No.: 940,742
[22] Filed: Sep. 8, 1992

Related U.S. Application Data

[63] Continuation of Ser. No. 622,355, Dec. 3, 1990, abandoned, which is a continuation of Ser. No. 264,901, Oct. 31, 1988, abandoned.

[30] Foreign Application Priority Data

Nov. 5, 1987 [JP] Japan .............................. 62-278285

[51] Int. Cl.⁵ .......................................... H01L 29/68
[52] U.S. Cl. .................................. 257/296; 257/635; 257/774
[58] Field of Search ...................... 357/23.6, 23.11, 54, 357/23.9, 49, 68; 257/296, 307, 308, 401, 635, 773, 774

[56] References Cited

U.S. PATENT DOCUMENTS

| | | | |
|---|---|---|---|
| 3,507,716 | 4/1970 | Nishida et al. | 257/635 |
| 3,852,104 | 12/1974 | Kooi et al. | 357/23.11 |
| 3,936,858 | 2/1976 | Seeds et al. | 357/23.11 |
| 4,535,426 | 8/1985 | Ariizumi et al. | 357/54 |
| 4,688,063 | 8/1987 | Lu et al. | 357/23.11 |
| 4,897,709 | 1/1990 | Yokoyama et al. | 357/23.6 |
| 4,931,845 | 6/1990 | Ema | 257/296 |
| 5,025,295 | 6/1991 | Kuesters et al. | 357/23.6 |

FOREIGN PATENT DOCUMENTS

| | | | |
|---|---|---|---|
| 0190928 | 8/1986 | European Pat. Off. | 357/23.9 |
| 0239250 | 9/1987 | European Pat. Off. | 357/23.3 |
| 0242893 | 10/1987 | European Pat. Off. | |
| 57-90971 | 6/1982 | Japan | 357/23.6 |
| 55258 | 11/1986 | Japan | |

OTHER PUBLICATIONS

Abbott et al., "N-channel goes to work with TTL," May 1972, *Electronics*, pp. 107-110.

(List continued on next page.)

*Primary Examiner*—Andrew J. James
*Assistant Examiner*—Courtney A. Bowers
*Attorney, Agent, or Firm*—Staas & Halsey

[57] ABSTRACT

A semiconductor integrated circuit device includes a semiconductor substrate, a field insulation film formed on a surface of the semiconductor substrate by a selective thermal oxidation process employing an oxidation-resistant mask whereby first and second groups of openings are formed therein for exposing the substrate at predetermined locations respectively corresponding to first and second active regions and relative to which first and second groups of contact holes are to be formed. An insulation film formed on the field insulation film is patterned to have first and second groups of openings therein corresponding to those in the field insulation film and arranged such that as to each of the contact holes of the first and second groups, a first pair of opposed edges extending in a first direction comprise the edges of the field insulation film defining the corresponding opening therein and the second pair of opposed edges thereof comprise the edges of the corresponding opening patterned in the second insulation film. The resultant structure affords reduced pitch of the contact holes in the second direction. A DRAM device so constructed comprises memory cells having storage electrodes extending through the respective contact holes of the first group and contacting the respective first active regions exposed therethrough, plural gate electrodes extending in the second direction, each associated memory capacitor and gate electrode comprising a memory cell, and a plurality of bit lines extending in the first direction and extending through and contacting respective second active regions through the respective contact holes of the second group.

18 Claims, 8 Drawing Sheets

OTHER PUBLICATIONS

Ohta et al., "Quadruply Self-Aligned Stacked High-Capacitance RAM Using $Ta_2O_5$ High-Density VLSI Dynamic Memory," Mar. 1982, *IEEE Transactions on Electronic Devices*, vol. ed.-29, No. 3, pp. 368–376.

Redding, "Borderless Diffusion Contact," Dec. 1981, *IBM Technical Disclosure Bulletin*, vol. 24, No. 7B, pp. 3806-7.

European Search Report, Application No. EP 88 31 0284, European Patent Office3, The Hague, Examiner Pheasant N.J., Jan. 31, 1989.

IBM Technical Disclosure Bulletin, vol. 27, No. 3, Aug. 1984, pp. 1809–1812, New York, US; C. G. Jambotkar: "Emitter butting against recessed oxide isolation in bipolar integrated circuits".

Patent Abstracts of Japan, vol. 11, No. 51 (E-480) [2498], Feb. 17, 1987; and JP-A-61 214 553 (Hitachi Ltd.), Aug. 24, 1986.

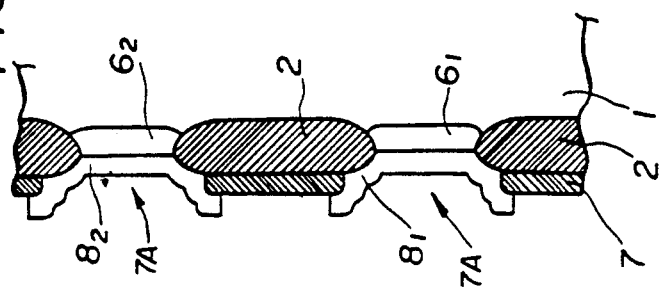
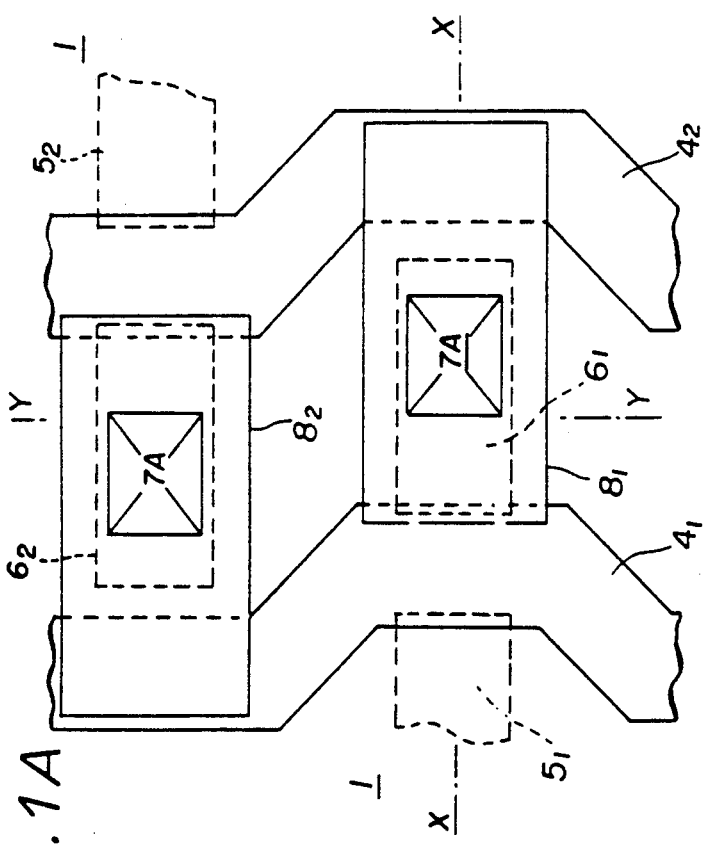
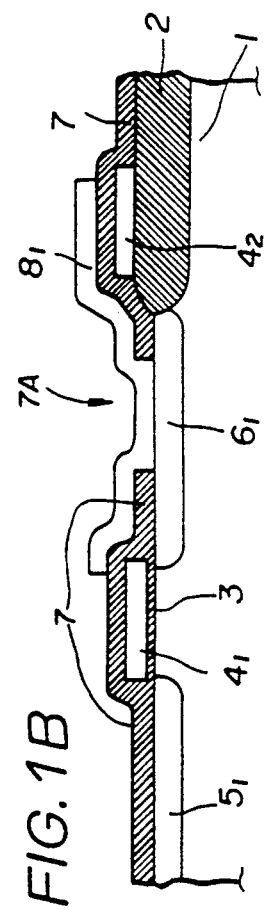

DYNAMIC RANDOM ACCESS MEMORY DEVICE HAVING IMPROVED CONTACT HOLE STRUCTURES

This application is a continuation, of application Ser. No. 07/622,355, filed Dec. 3, 1990, now abandoned, in turn a continuation of U.S. Ser. No. 07/264,901 filed Oct. 31, 1988, abandoned.

BACKGROUND OF THE INVENTION

The present invention generally relates to a semiconductor integrated circuit device, and particularly to an improvement of a contact hole structure used for making an electrical contact between a silicon substrate and a conductive film such as an electrode and a wiring (interconnection) line. More particularly, the present invention relates to a semiconductor integrated circuit device having a contact hole structure which can provide a pitch between adjacent electrodes or wiring lines which is narrower than a minimum pitch obtained by photolithography technology.

Generally, an electrode or a wiring line of a semiconductor integrated circuit device is formed by forming a contact hole in an insulation film formed on the surface of a substrate and then forming an electrode or a wiring line which is provided so as to cover the contact hole and which is a little larger (wider) than the contact hole. The use of the larger electrode or wiring line is intended to cope with the occurrence of a positional error or alignment error which may occur at the time of forming an electrode or wiring line. That is, the electrode or wiring line is designed to have an alignment tolerance. The alignment tolerance functions to prevent a surface area of the substrate from appearing even when an alignment error occurs. If a surface area appears due to the alignment error, it is exposed to etching, and therefore a recess portion is formed in the substrate.

The distance between the centers of neighboring electrodes (hereinafter referred to as an electrode pitch) which are in contact with the substrate through respective contact holes, is necessarily defined as a function of various parameters such as the size of a contact hole, an alignment tolerance of an electrode, and a distance between opposed edges of the neighboring electrodes. Generally, the above parameters depend on the accuracy of photolithography technology. As a result, the electrode pitch depends on the accuracy of photolithography technology. This means that there is a limit on the electrode pitch which can be obtained by photolithography technology. The above holds true for a wiring line which is in contact with a substrate through a contact hole.

In order to enhance the integration density of a semiconductor integrated circuit device, it is essential to reduce the electrode pitch. However, with current production processes which employ photolithography technology, a further reduced electrode pitch cannot be obtained. For this reason, a means which enables the electrode pitch to be reduced, is desired.

SUMMARY OF THE INVENTION

It is therefore a general object of the present invention to provide a semiconductor integrated circuit device in which the aforementioned disadvantages of the conventional device are eliminated.

Another object of the present invention is to provide a semiconductor integrated circuit device in which electrodes or wiring lines are arranged with a pitch smaller than a minimum pitch available by the conventional photolithography technology.

The above objects of the present invention are achieved by providing an improved contact hole structure. The semiconductor integrated circuit device of the present invention comprises a semiconductor substrate, a field insulation film formed on a surface of the semiconductor substrate by a selective thermal oxidation process in which an oxidation-resistant mask is used, an insulation film formed on the field insulation film, and a conductive film covering and extending through a contact hole in the insulation film so as to be in contact with the surface of the substrate. The edges of the contact hole extending in a first direction are defined by edges of the field insulation film exposed by patterning in forming the contact holes. On the other hand, edges of the contact hole extending in a second direction transverse to the first direction are defined by the latter edges of the insulation film surrounding the contact hole and formed by patterning.

Other objects, features and advantages of the present invention will become apparent from the following detailed description when read in conjunction with the accompanying drawings.

BRIEF DESCRIPTION OF THE DRAWINGS

FIG. 1A is a plan view of an essential part of a preferred embodiment of the present invention;

FIGS. 1B and 1C are cross sectional views taken along lines X—X and Y—Y shown in FIG. 1A, respectively;

DETAILED DESCRIPTION

Figure 2A:
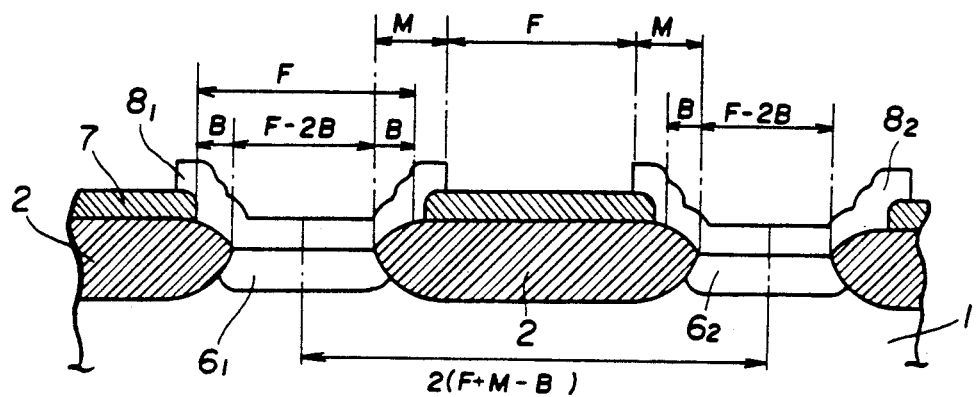
FIGS. 2A and 2B are cross sectional views along the line Y—Y which respectively illustrate differences between the present invention and the prior art.

In order to meet the requirement for reducing the electrode pitch or wiring pitch, the inventor considered a contact structure in which an edge of a field insulation film itself is used as an edge of a contact hole extending in a first direction perpendicular to a second direction in which it is necessary to establish a very small pitch, requiring high alignment or positioning accuracy.

Generally, in a semiconductor integrated circuit device, a very high alignment accuracy is required in one of two mutually orthogonal directions, which are hereinafter referred to as X and Y directions. For example, when a very high alignment accuracy is required for reducing the size of elements in the Y direction, a relatively large tolerance of alignment accuracy is generally allowed in the X direction. Therefore, an edge of an electrode contact hole which extends in the Y direction may be formed by using a resist mask used as in the conventional photolithography technology.

It is well known that a field insulation film such as a silicon dioxide ($SiO_2$) film is formed by coating a part of a surface of a silicon substrate with an oxidation-resistant mask such as a silicon nitride ($Si_3N_4$) mask, and then subjecting the silicon substrate to selective thermal oxidation. It is also known that a bird's beak resulting from oxidation in a lateral direction is produced at an edge of the field insulation film produced in the aforementioned process. By removing the silicon nitride film used as the oxidation-resistant mask, a portion of the silicon surface is exposed which has a size smaller than a designed size.

The present invention utilizes the bird's beak to define an edge of a contact hole which extends in a first direction perpendicular to a second direction in which a very high alignment accuracy is required. With this proposal, it becomes possible to obtain a reduced electrode pitch or wiring line pitch, which cannot be obtained by the conventional photolithography technology.

It is noted that the Japanese Patent Publication No. 61-55258 suggests a variation in contact size due to lateral oxidation (bird's beak) which occurs in a case when a selectively oxidized insulation film is formed by local oxidation. The above publication teaches that a change in contact size due to lateral oxidation causes an increase of a leakage current which passes through a MOS device. On the other hand, the present invention intends to positively utilize the bird's beak in order to reduce the electrode pitch.

FIGS. 1A through 1C are views of a portion of a semiconductor integrated circuit device of the invention for explaining important features of the present invention. FIG. 1A is a plan view of a portion of the device of the invention, FIG. 1B is a cross sectional view taken along a line X—X shown in FIG. 1A, and FIG. 1C is a plan view taken along a line Y—Y shown in FIG. 1A. The illustrated semiconductor integrated circuit device is a stacked capacitor type dynamic random access memory device (hereinafter simply referred to as a DRAM device). The DRAM device comprises a plurality of memory cells, each of which consists of a memory capacitor and a transfer gate transistor.

Referring to FIGS. 1A through 1C, a field insulation film 2 made of silicon dioxide ($SiO_2$) is partially formed on a surface of a p-type silicon substrate 1. A gate insulation film 3 made of silicon dioxide ($SiO_2$) is formed on the surface of the substrate 1. Gate electrodes $4_1$ and $4_2$ made of polysilicon are formed on the gate insulation film 3 and the field insulation film 2, respectively. The gate electrodes $4_1$ and $4_2$ are used as word lines of the DRAM device. An $n^+$-type source region $5_1$, which is a bit line contact region, is formed in the substrate 1. Further, $n^+$-type drain regions $6_1$ and $6_2$, which are capacitor contact regions, are formed in the substrate 1. An interlayer insulation film 7 is formed as shown by chemical vapor deposition (CVD). Storage electrodes $8_1$ and $8_2$, each of which is one of the paired electrodes of a memory capacitor, are formed as shown in FIGS. 1B and 1C. It is noted that for the sake of simplicity, some conventional elements of the DRAM are omitted. For example, there are omitted an opposed electrode, called a cell plate, a bit line contact window formed on the source region of a transfer gate transistor, a wiring line used for forming a low resistance bit line and a low resistance word line and some insulation films. Further, in FIG. 1A, insulation layer 7 and field oxide regions 2 are omitted to facilitate the illustration of remaining elements of the structures as shown in the cross-sectional views of FIGS. 1B and 1C.

As can be seen particularly in FIG. 1B, with respect to the storage electrodes $8_1$ and $8_2$, edges of the contact holes, which edges extend in the Y direction, are formed by patterned edges of the interlayer insulating film 7. On the other hand, it can be seen from FIG. 1C that edges of the contact holes, which edges extend in the X direction, are defined by edges of the field insulation films 2 which have bird's beaks; in the latter case, a further portion of the side wall of the contact hole is formed by a vertical end surface of the interlayer insulating film 7, situated on the film 2, as seen in FIG. 1C. The electrode $8_1$ is deposited on the surface of the drain region $6_1$, the edges (bird's beaks) of the field insulation film 2, and end portions of the interlayer insulation film 7.

Figure 2B:
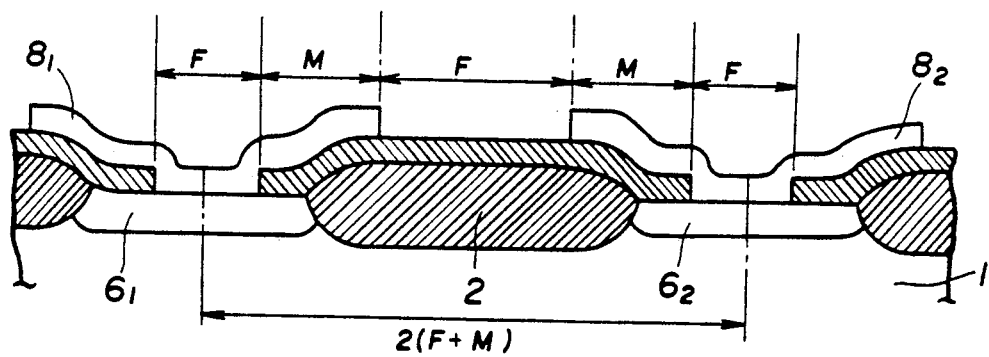

A description is given of electrode pitches obtained by photolithography technology and the present invention with reference to FIGS. 2A and 2B. The structure of FIG. 2A corresponds to that of FIG. 1C, and FIG. 2B illustrates a corresponding structure of a conventional semiconductor integrated circuit device in the Y direction. In FIGS. 2A and 2B, F is a minimum pattern width which is determined depending on the accuracy of photolithography technology, M is an alignment tolerance, and B is a length of a bird's beak in the Y direction. In FIG. 2B, elements identical to or similar to those in the previous figures are indicated by the same reference numerals.

It can be seen from FIG. 2A that in the Y direction the electrode pitch of the present invention is represented as $2(F+M-B)$, and the electrode pitch of the conventional device is represented as $2(F+M)$. For example, when $F=1.0$ [$\mu$m], $M=0.3$ [$\mu$m], and $B=0.3$ [$\mu$m], the electrode pitch of the present invention is equal to 2.0 [$\mu$m], and on the other hand, the electrode pitch of the conventional device is equal to 2.6 [$\mu$m]. That is, with the present invention, it is possible to obtain a 23% reduction of the electrode pitch. As a result, in the Y direction in which the electrode pitch is desired to be as small as possible, there is obtained the electrode pitch having a size smaller than the minimum size available by the conventional photolithography technology. Hence a reduced element of the device can be obtained, and thereby the integration density can be improved. As will be described later, the contact hole of the present invention can be formed by using a slightly modified mask for forming the contact hole. This means that the contact hole of the present invention can be provided by the currently available production process. Further, since edges of the contact hole in the same direction are formed by the same process, there is no difference in electrical characteristics between elements in the device even when the alignment error occurs.

A description is given of a preferred embodiment of the present invention with reference to FIGS. 3 through 15, which show respective, important steps of the production process for producing the preferred embodiment of the present invention. FIGS. 3 through 9 are cross sectional views taken along the line X—X shown in FIG. 1A, and FIGS. 10 through 15 are cross sectional views taken along the line Y—Y shown in FIG. 1A. In FIGS. 3 through 15, those parts which are the same as those in the previous figures, are given the same reference numerals. It is noted that some cross sections shown in these figures do not necessarily correspond to that of FIG. 1A, and may be wider than the cross section defined in FIG. 1A.

Figure 3:
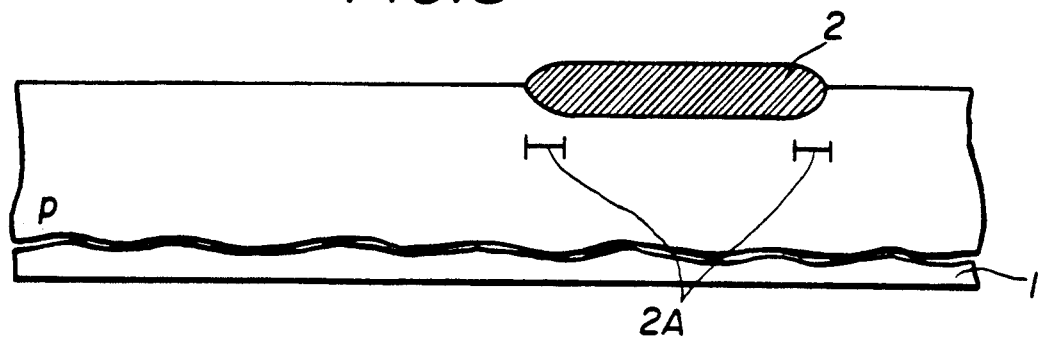
FIGS. 3 through 9, and FIGS. 10 through 15 are cross sectional views along the lines X—X and Y—Y respectively, as shown in FIG. 1A, at successive stages in the process of forming the structure of the invention.
Figure 10:
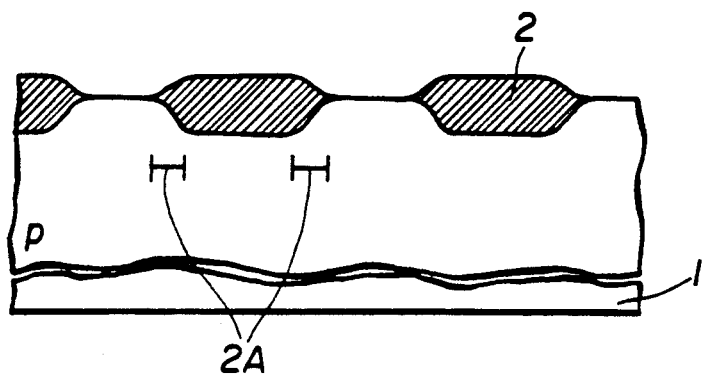

Referring to FIGS. 3 and 10, a photoresist film which covers active regions is formed by a resist process employed in the conventional photolithography technology. Thereafter, boron (B) ions are implanted into regions other than the active regions by ion implantation. Thereby an element separation region (not shown) is formed.

The photoresist film is removed, and then the field insulation film 2 is formed by the conventional selective thermal oxidation process in which a silicon nitride (Si$_3$N$_4$) film or the like is used as a oxidation-resistant mask.

It is well known that an edge of the field insulation film 2 thus formed goes under the oxidation-resistant mask. This edge is the bird's beak. In FIGS. 3 and 10, each of the bird's beaks is indicated by an H-shaped symbol indicated by a reference 2A. The size of the bird's beak depends on thickness and width of the oxidation-resistant mask and so on. Generally, the width of the bird's beak edge is approximately 3000 [Å]. By removing the oxidation-resistant mask, the bird's beaks 2A of the field insulation film 2 appear.

Figure 4:
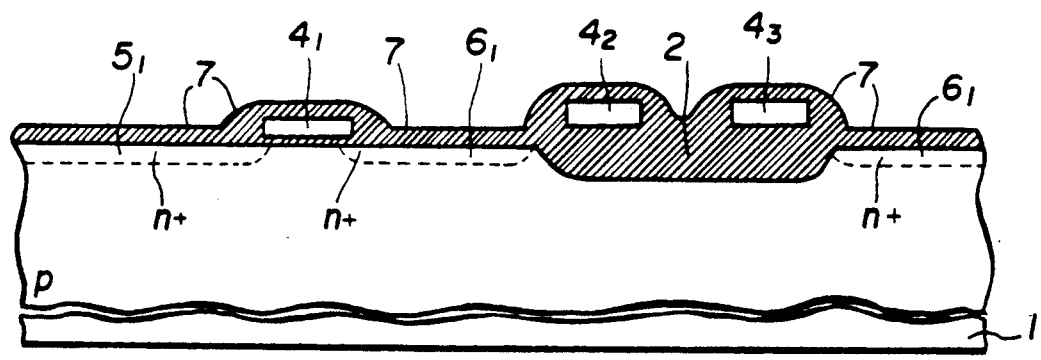
Figure 11:
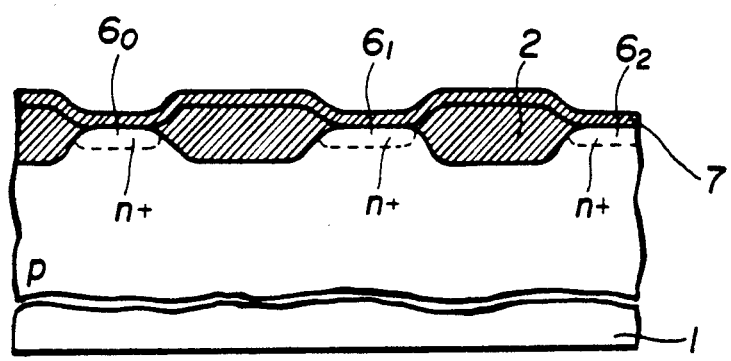

Referring to FIGS. 4 and 11, the gate insulation film such as a silicon dioxide film having a thickness of approximately 200 [Å], is formed by thermal oxidation. In FIGS. 4 and 11, the gate insulation film is illustrated integrally with the interlayer insulation film 7 for the sake of simplicity. Thereafter, a polysilicon film is deposited to a thickness of approximately 2000 [Å] by chemical vapor deposition (CVD). Then, gate electrodes $4_1$, $4_2$, $4_3$, . . . are formed by patterning the polysilicon film by the conventional photolithography technology. The gate electrodes $4_1$, $4_2$, $4_3$, . . . are word lines. By ion implantation, arsenic (As) ions are implanted into the substrate 1, and thereby n$^+$-type source regions $5_1$, $5_2$, . . . are formed, and n$^+$-type drain regions $6_0$, $6_1$, $6_2$, . . . are formed (see FIGS. 1A, 4 and 11). The source regions $5_1$, $5_2$, . . . are bit line contact regions, and the drain regions $6_0$, $6_1$, $6_2$, . . . are contact regions for storage electrodes of memory capacitors. Prior to the aforementioned ion implantation step, a protection film such as a silicon dioxide (SiO$_2$) film may be formed as necessary.

Then the interlayer insulation film 7 such as a silicon dioxide (SiO$_2$) film is deposited to a thickness of approximately 1000 [Å] by chemical vapor deposition.

Figure 5:
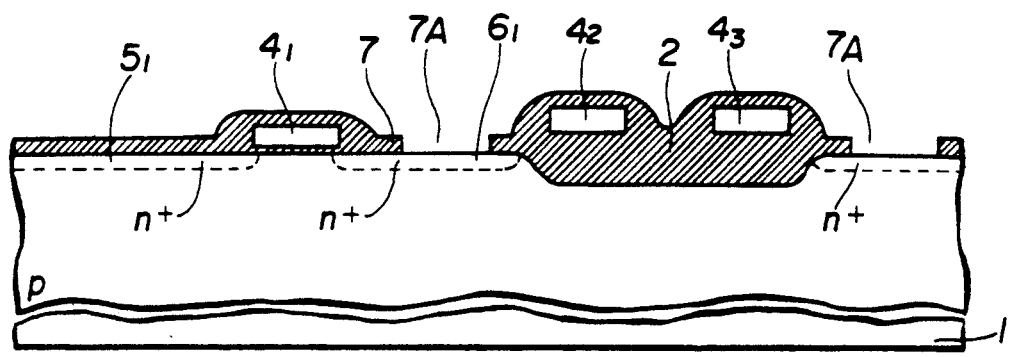
Figure 12:
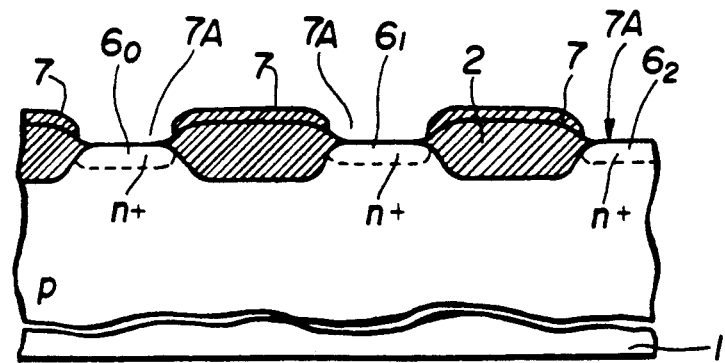

Referring to FIGS. 5 and 12, the interlayer insulation film 7 is subjected to anisotropic etching by using the resist process in the conventional photolithography technology and reactive ion etching (RIE) in which an etching gas of CHF$_3$+H$_2$ is used. Thereby, a contact hole 7A is formed in (and through) the interlayer insulation film 7. In this case, it is essential to use the etching mask having a mask size which makes it possible to obtain an exposed active region surface (drain region surface) having a size identical to a designed size with respect to the X direction, and which enables the edges 2A (see FIGS. 10 and 12) of the field insulation film 2 (i.e., the bird's beak portions 2A) to be exposed with respect to the Y direction.

The step of FIGS. 5 and 12 is very important, and is clearly distinct from the conventional step. In order to expose the bird's beaks 2A of the field insulation film 2 without the bird's beaks 2A being damaged due to the aforementioned etching process upon the removal of the insulating film 7 by the etching and the resultant exposure of the underlying bird's beaks 2A, it is necessary to detect a variation of an emission spectrum of RIE plasma which occurs when the substrate 1 becomes exposed by etching of the interlayer insulation film 7, and to terminate etching when the variation is detected. With this process, it is possible to form the exposed active region surface having a size in the Y direction which cannot be achieved by the conventional photolithography technology. As a result, a reduced electrode pitch and a reduced memory cell can be obtained.

Figure 6:
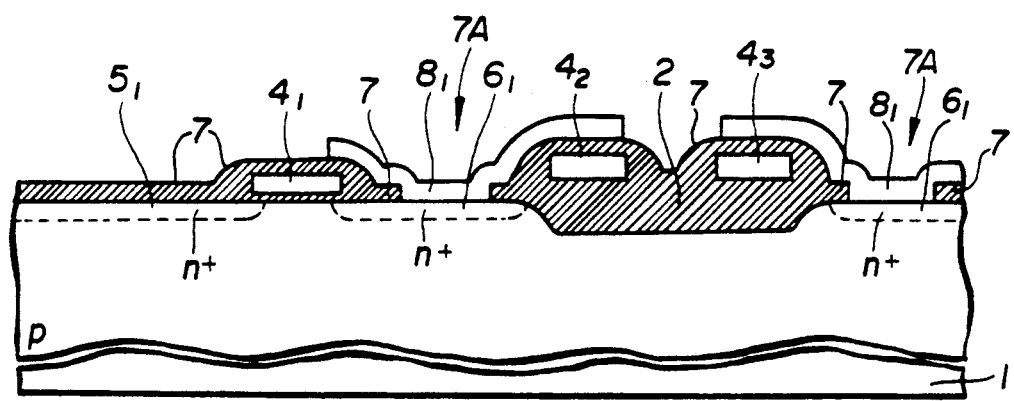
Figure 7:
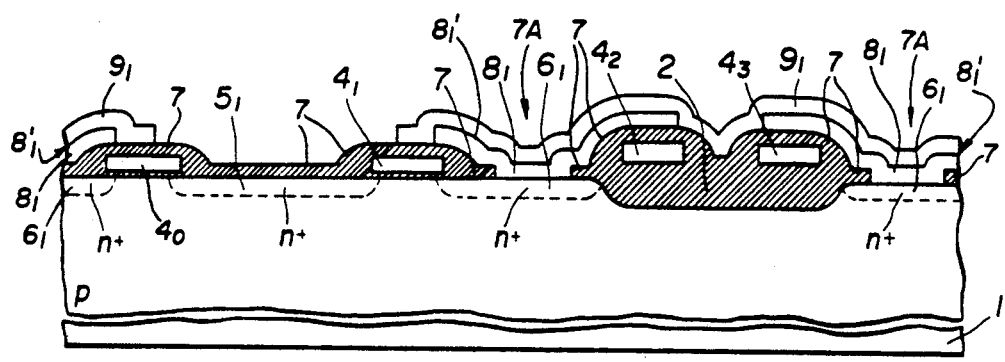
Figure 13:
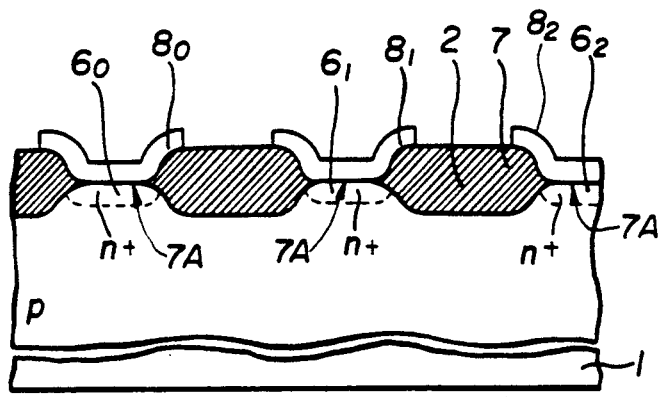
Figure 14:
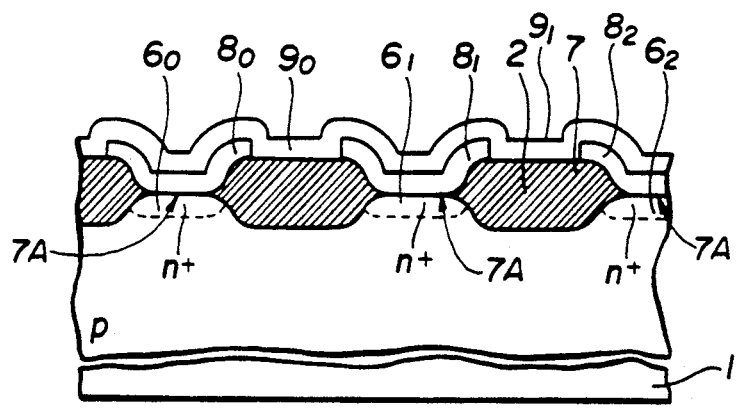

Referring to FIGS. 6 and 13, the polysilicon film 8 is deposited to a thickness of approximately 2000 [Å] by chemical vapor deposition. Then the polysilicon film 8 is patterned by the conventional photolithography technology, and thereby the storage electrodes $8_0$, $8_1$, $8_2$, . . . are formed. Each storage electrode is one of the paired electrodes of a memory capacitor. Then, silicon dioxide (SiO$_2$) films $8_0'$, $8_1'$, $8_2'$ are formed so as to cover the respective storage electrodes $8_0$, $8_1$, $8_2$ . . . by thermal oxidation. The silicon dioxide films 8, thus formed function as dielectric films of the respective memory capacitor. Each silicon dioxide film is very thin, e.g., a thickness of approximately 100 [Å], and therefore is not shown as a distinct, or separate later and instead is in FIGS. 7 and 14 represented by the lines $8_0'$, $8_1'$, . . . etc.

Thereafter, the polysilicon film 9 is deposited to a thickness of about 2000 [Å] by chemical vapor deposition. Then the polysilicon film 9 is subjected to the patterning process which employs the conventional photolithography technology. Thereby, the opposed electrodes $9_0$, $9_1$, . . . , are formed (see FIGS. 8 and 15), each of which is the other electrode of the memory cell and is called a cell plate.

Figure 8:
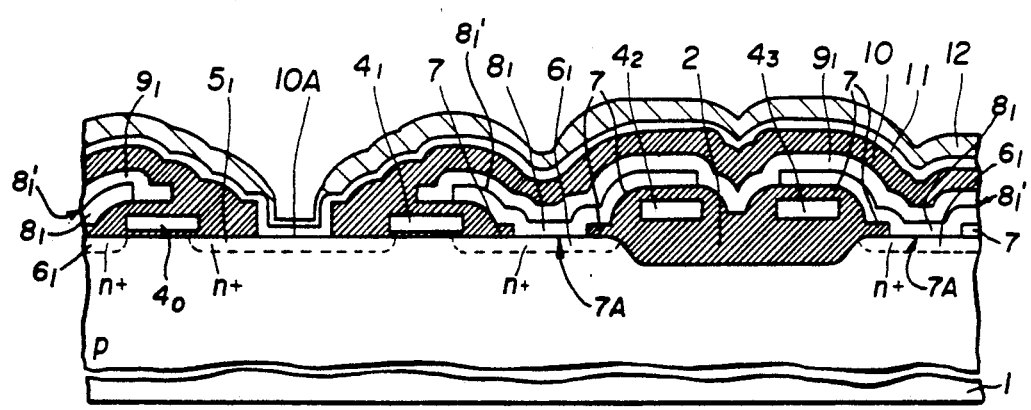
Figure 15:
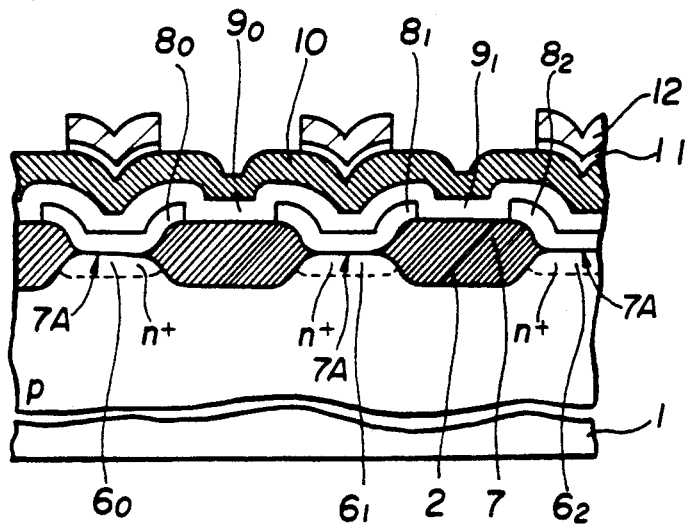

Referring to FIGS. 8 and 15, the interlayer insulation film 10 is deposited to a thickness of 2500 [Å], for example, by chemical vapor deposition. Then, the interlayer insulation film 10 is subjected to anisotropic etching by using the resist process of the conventional photolithography technology and reactive ion etching in which an etching gas of CHF$_3$+H$_2$ is used. By anisotropic etching, a layer portion from the surface of the interlayer insulation film 10 to the substrate 1 is removed, and thereby a contact hole 10A is formed in the interlayer insulation film 10.

In this case, it is necessary to use an etching mask similar to that of the etching mask used in the aforementioned step. That is, the etching mask has a mask size which makes it possible to obtain an exposed active region surface (source region surface) which has a size identical to a designed size with respect to the X direction, and which enables the edges of the field insulation film 2 to be exposed with respect to the Y direction. As in case of the step related to FIGS. 5 and 12, in order to expose the edges of the field insulation film 2 without the edges being damaged due to etching, it is essential to detect a variation of an emission spectrum of RIE plasma which occurs when the substrate 1 is exposed by etching for the interlayer insulation film 7, and to terminate etching when the variation is detected. With this process, it is possible to form the exposed active region surface having a size which cannot be achieved by the conventional photolithography technology process and which is identical to a designed size. As a result, a reduced electrode pitch and a reduced memory cell can be obtained.

Thereafter, a polysilicon film 11 is deposited to a thickness of approximately 1000 [Å] by chemical vapor deposition. Subsequently, a tungsten silicide (WSi$_x$) film 12 having a thickness of approximately 2000 [Å] is formed by sputtering. Then the polysilicon film 11 and the tungsten silicide film 12 are patterned by the conventional photolithography technology, and thereby bit lines are formed.

Figure 9:
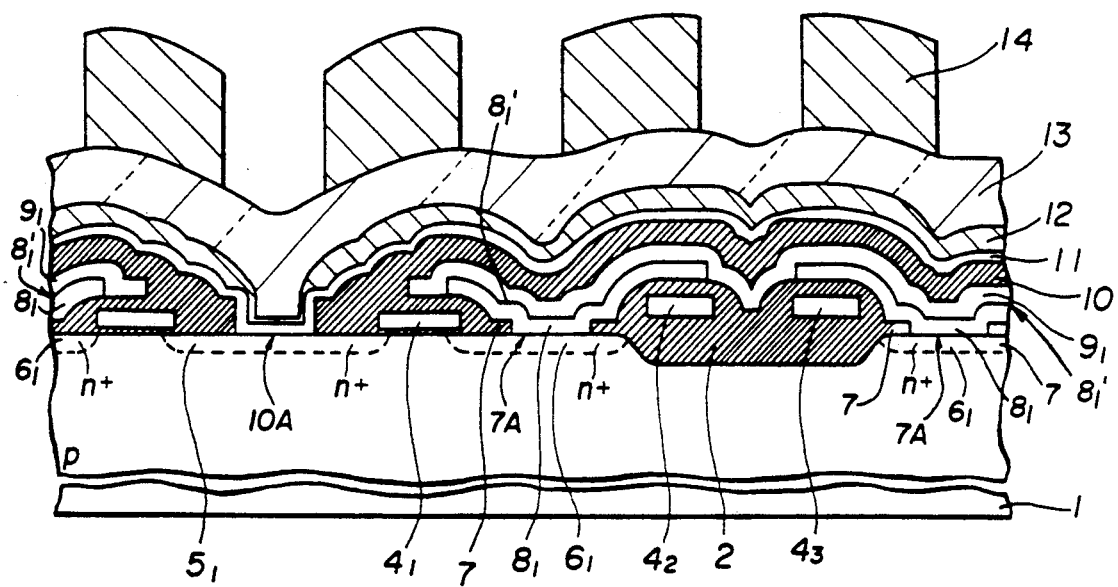

Referring to FIG. 9, a passivation film 13 of a phosphosilicate glass (PSG) film is deposited on the entire surface of the tungsten silicide film 12 by chemical vapor deposition. Then gate wiring lines 14 made of aluminum for example, are formed on top of the passivation film 13. The gate wiring lines 14 are used for making electrical connections to the gate electrodes $4_1$, $4_2$ and so on. The passivation film 13 and the gate wiring lines 14 are employed in the conventional DRAM device. Finally a phosphosilicate glass film and a silicon nitride film are grown as a cover film, and then bonding pads are formed on the cover film not shown, but conventional.

Materials used for forming the aforementioned films are not limited to the aforementioned embodiment. Appropriate materials as used in conventional devices can be employed. Further, thicknesses of the films are not limited to the aforementioned thickness. The present invention is not limited to the aforementioned stacked capacitor type DRAM device, and includes other types of devices.

The present invention is not limited to the aforementioned embodiment, and variations and modifications may be made without departing from the scope of the present invention.

What is claimed is:

1. A dynamic random access memory device comprising:

a semiconductor substrate having a main surface and a plurality of pairs of first and second active regions formed in the main surface;

a field insulation film formed on the main surface of the semiconductor substrate by a selective oxidation process step utilizing an oxidation-resistant mask patterned to form, in the field insulation film, plural openings through which corresponding pairs of first and second active regions of the main surface are exposed, each opening being defined by respective, first and second pairs of opposed, interior edges of the field insulation film respectively extending in first and second substantially mutually perpendicular directions and respectively spaced apart by first and second distances;

a plurality of gate electrodes disposed in insulated relationship on the main surface of the semiconductor substrate, the gate electrodes extending in the second direction and the adjacent gate electrodes being displaced in the first direction, each gate electrode being associated with and disposed intermediate the first and second active regions of at least one corresponding pair thereof;

a second insulation film formed on the field insulation film, the gate electrodes and the semiconductor substrate, the second insulation film being thinner than the field insulation film and patterned to include therein a first group of openings corresponding to a first group of contact holes aligned with corresponding openings in the field insulation film and though which respectively corresponding first active regions are exposed and a second group of openings corresponding to a second group of contact holes respectively associated with said first group of contact holes and aligned with respectively corresponding openings in the field insulation film and through which respectively corresponding second active regions are exposed, each opening in the second insulation film being defined by first and second pairs of opposed, interior edges of the second insulating film respectively extending in said first and second substantially mutually perpendicular directions and respectively spaced apart by third and fourth distances, the third distance being greater than the first distance and the fourth distance being smaller than the second distance;

each contact hole of each of the first and second groups having first and second pairs of opposed edges respectively extending in said first and second, substantially mutually perpendicular directions, the first pair of opposed edges of each contact hole comprising the first pair of opposed, interior edges of the corresponding opening in the field insulation film and the second pair of opposed edges of each contact hole comprising the second pair of opposed, interior edges of the corresponding opening in the second insulation film;

a plurality of memory capacitors respectively associated with the plurality of pairs of first and second active regions, each memory capacitor comprising a storage electrode, an opposed electrode and a dielectric film interposed between the storage electrode and the opposed electrode, the storage electrode extending through a corresponding contact hole of the first group and being disposed on and contacting the respective first active region exposed therethrough, each pair of first and second active regions and the respectively associated memory capacitor and gate electrode comprising a memory cell; and a plurality of bit lines formed in insulated relationship on said substrate and extending in the first direction thereon, the adjacent bit lines being displaced in the second direction and each bit line being connected through at least one respective contact hole of the second group to the corresponding second active region exposed therethrough.

2. A dynamic random access memory device as claimed in claim 1, wherein the second direction is a direction in which a reduced pitch between adjacent ones of the storage electrodes is required.

3. A dynamic random access memory device as claimed in claim 1, wherein each said first pair of opposed interior edges of the respective openings in said field insulation film comprises corresponding bird's beak portion of the field insulation film, as formed by the selective oxidation process.

4. A dynamic random access memory device as claimed in claim 1, wherein each storage electrode comprises a central portion disposed on and contacting the respective first active region as exposed through the corresponding contact hole of the first group and integral, peripheral portions disposed on respective, peripheral portions of the field insulation film contiguous the first pair of opposed interior edges thereof and of the second insulation layer contiguous the second pair of opposed interior edges thereof.

5. A dynamic random access memory device as claimed in claim 1, wherein said fourth distance is less than said first distance.

6. A dynamic random access memory device as claimed in claim 1, wherein each of the first and second active regions is doped with an impurity.

7. A dynamic random access memory device as claimed in claim 1, further comprising:

a third insulation film formed on the second insulation film and covering the memory cells and gate electrodes and having a plurality of openings therein respectively corresponding to the second group of openings in the second insulation film and thus to the second group of contact holes; and the plurality of bit lines being formed on the third insulation film and at least one portion of each said bit line extending through said at least one respective contact hole of the second group and contacting the corresponding, second active region exposed therethrough.

8. A semiconductor device having a contact hole, comprising:
- a semiconductor substrate having a main surface and an active region formed in the main surface;
- a field insulation film formed on the main surface of the semiconductor substrate by a selective oxidation process step utilizing an oxidation-resistant mask patterned to form, in the field insulation film, an opening through which the active region of the main surface is exposed, the opening being defined by first and second pairs of opposed, interior edges of the field insulation film respectively extending in first and second substantially mutually perpendicular directions and respectively spaced apart by first and second distances;
- a second insulation film formed on the field insulation film and the active region of the semiconductor substrate as exposed through the opening in the field insulation film, the second insulation film being thinner than the field insulation film and patterned to include therein an opening corresponding to the opening in the field insulation film and though which the active region is exposed, the opening in the second insulation film being defined by first and second pairs of opposed, interior edges of the second insulating film respectively extending in said first and second substantially mutually perpendicular directions and respectively spaced apart by third and fourth distances, the third distance being greater than the first distance and the fourth distance being smaller than the second distance; and
- the contact hole having first and second pairs of opposed edges respectively extending in said first and second, substantially mutually perpendicular directions, the first pair of opposed edges of the contact hole comprising the first pair of opposed, interior edges of the opening in the field insulation film and the second pair of opposed edges of the contact hole comprising the second pair of opposed, interior edges of the opening in the second insulation film.

9. A semiconductor device as claimed in claim 8, wherein the first pair of opposed interior edges of the opening in the field insulation film comprises corresponding bird's beak portion of the field insulation film, as formed by the selective oxidation process.

10. A semiconductor device as claimed in claim 8, wherein said fourth distance is less than said first distance.

11. A semiconductor device as claimed in claim 8, wherein the active region is doped with an impurity.

12. A dynamic random access memory device comprising:
- a semiconductor substrate having a main surface and a plurality of pairs of first and second active regions formed in the main surface;
- a field insulation film formed on the main surface of the semiconductor substrate by a selective oxidation process step utilizing an oxidation-resistant mask patterned to form, in the field insulation film, plural openings through which corresponding pairs of first and second active regions of the main surface are exposed, each opening being defined by respective, first and second pairs of opposed, interior edges of the field insulation film respectively extending in first and second substantially mutually perpendicular directions and respectively spaced apart by first and second distances;
- a plurality of gate electrodes disposed in insulated relationship on the main surface of the semiconductor substrate, the gate electrodes extending in the second direction and the adjacent gate electrodes being displaced in the first direction, each gate electrode being associated with and disposed intermediate the first and second active regions of at least one corresponding pair thereof;
- a second insulation film formed on the field insulation film, the gate electrodes and the semiconductor substrate, the second insulation film being thinner than the field insulation film and patterned to include therein a first group of openings corresponding to a first group of contact holes aligned with corresponding openings in the field insulation film and though which respectively corresponding first active regions are exposed and a second group of openings corresponding to a second group of contact holes respectively associated with said first group of contact holes and aligned with respectively corresponding openings in the field insulation film and through which respectively corresponding second active regions are exposed, each opening of the first group in the second insulation film being defined by first and second pairs of opposed, interior edges of the second insulating film respectively extending in said first and second substantially mutually perpendicular directions and respectively spaced apart by third and fourth distances, the third distance being greater than the first distance and the fourth distance being smaller than the second distance;
- each contact hole of the first group having first and second pairs of opposed edges respectively extending in said first and second, substantially mutually perpendicular directions, the first pair of opposed edges of each contact hole of the first group comprising the first pair of opposed, interior edges of the corresponding opening in the field insulation film and the second pair of opposed edges of each contact hole of the first group comprising the second pair of opposed, interior edges of the corresponding opening in the second insulation film;
- a plurality of memory capacitors respectively associated with the plurality of pairs of first and second active regions, each memory capacitor comprising a storage electrode, an opposed electrode and a dielectric film interposed between the storage electrode and the opposed electrode, the storage electrode extending through a corresponding contact hole of the first group and being disposed on and contacting the respective first active region exposed therethrough, each pair of first and second active regions and the respectively associated memory capacitor and gate electrode comprising a memory cell; and
- a plurality of bit lines formed in insulated relationship on said substrate and extending in the first direction thereon, the adjacent bit lines being displaced in the second direction and each bit line being connected through at least one respective contact hole of the second group to the corresponding second active region exposed therethrough.

13. A dynamic random access memory device as claimed in claim 12, wherein the second direction is a direction in which a reduced pitch between adjacent ones of the storage electrodes is required.

14. A dynamic random access memory device as claimed in claim 12, wherein each said first pair of opposed interior edges of the respective openings in said field insulation film corresponding to the contact holes of the first group comprises corresponding bird's beak portions of the field insulation film, as formed by the selective oxidation process.

15. A dynamic random access memory device as claimed in claim 12, wherein each storage electrode comprises a central portion disposed on and contacting the respective first active region as exposed through the corresponding contact hole of the first group and integral, peripheral portions disposed on respective, peripheral portions of the field insulation film contiguous the first pair of opposed interior edges thereof and of the second insulation layer contiguous the second pair of opposed interior edges thereof and respectively comprising the first and second pairs of opposed edges of the corresponding contact hole of the first group.

16. A dynamic random access memory device as claimed in claim 12, wherein said fourth distance is less than said first distance.

17. A dynamic random access memory device as claimed in claim 12, wherein each of the first and second active regions is doped with an impurity.

18. A dynamic random access memory device as claimed in claim 12, further comprising:
   a third insulation film formed on the second insulation film and covering the memory cells and gate electrodes and having a plurality of openings therein respectively corresponding to the second group of openings in the second insulation film and thus to the second group of contact holes; and
   the plurality of bit lines being formed on the third insulation film and at least one portion of each said bit line extending through said at least one respective contact hole of the second group and contacting the corresponding, second active region exposed therethrough.

* * * * *

UNITED STATES PATENT AND TRADEMARK OFFICE
CERTIFICATE OF CORRECTION

PATENT NO. : 5,247,197
DATED : Sep. 21, 1993
INVENTOR(S) : EMA

It is certified that error appears in the above-indentified patent and that said Letters Patent is hereby corrected as shown below:

Col. 1, line 42, after "holes" delete ",".

Col. 2, line 58, delete "used".

Col. 6, line 12, change "8;" to --8'--;
line 16, change "later" to --layer--.

Col. 7, line 9, before "not" insert --(--;
line 10, after "ventional" insert --)--;
line 56, change "though" to --through--.

Col. 8, line 43, change "portion" to --portions--.

Col. 9, line 52, change "portion" to --portions--.

Signed and Sealed this

Eighth Day of November, 1994

Attest:

BRUCE LEHMAN

Attesting Officer

Commissioner of Patents and Trademarks